United States Patent [19]
Christensen

[11] Patent Number: 5,977,718
[45] Date of Patent: Nov. 2, 1999

[54] GATED PIXEL ELEMENTS USING POLYMER ELECTROLUMINESCENT MATERIALS FOR PANEL DISPLAYS

[76] Inventor: Alton O. Christensen, 16106 S. Ravenswood, Magnolia, Tex. 77355-1233

[21] Appl. No.: 08/907,559

[22] Filed: Aug. 8, 1997

[51] Int. Cl.⁶ .............................. H01J 63/04; H05B 33/14
[52] U.S. Cl. .................. 315/169.1; 313/503; 313/504; 257/40
[58] Field of Search .......................... 315/169.1, 169.3, 315/169.4; 313/503, 504; 257/40, 59

[56] References Cited

U.S. PATENT DOCUMENTS

| | | | |
|---|---|---|---|
| 4,020,389 | 4/1977 | Dickson et al. | 315/246 |
| 4,399,605 | 8/1983 | Dash et al. | 29/571 |
| 5,128,587 | 7/1992 | Skotheim et al. | 313/504 |
| 5,294,870 | 3/1994 | Tang et al. | 315/169.3 |
| 5,376,456 | 12/1994 | Cumming et al. | 313/504 |
| 5,608,287 | 3/1997 | Hung et al. | 313/503 |
| 5,656,883 | 8/1997 | Christensen | 313/310 |
| 5,684,365 | 11/1997 | Tang et al. | 315/169.3 |
| 5,723,873 | 3/1998 | Yang | 257/40 |

*Primary Examiner*—Don Wong
*Assistant Examiner*—Hoang Nguyen
*Attorney, Agent, or Firm*—Gunn & Associates, P.C.

[57] ABSTRACT

A gated pixel device employing conjugated polymer electroluminescent material is disclosed. Pixel devices are triodes or diodes. Conjugated polymer electroluminescent material is spun onto a flexible, transparent substrate thereby reducing fabrication cost when compared to conventional material deposition techniques. A plurality of pixels can be integrally fabricated on a common, flexible, transparent substrate thereby producing a display panel which can be formed or shaped into any desired geometry, and thereby creating applications not possible with conventional, rigid flat panel displays in the prior art. Both monocolor and full color flexible display panels are disclosed.

38 Claims, 2 Drawing Sheets

GATED PIXEL ELEMENTS USING POLYMER ELECTROLUMINESCENT MATERIALS FOR PANEL DISPLAYS

BACKGROUND OF THE INVENTION

1. Field of the Invention

This disclosure sets forth pixel elements which uses polymer electroluminescent materials, and more particularly integrally fabricated pixel elements and control circuitry for flexible, flat panel displays.

2. Background of the Art

Early prior art electroluminescent (EL) devices used in flat panel displays are called are diodes in which applied alternating current (AC) or direct current (DC) or pulse potentials affect luminescence. The diode or two terminal embodiment of flat display panel pixels presents significant operational and manufacturing limitations. One limitation is in the form of a barrier contacts at both the injector and the collector terminals of the diode. These barrier contacts increase significantly the potential required for the luminescence, and decrease the operational lifetime of the device because of cumulative terminal EL material interface stress. The stress of the high field of the non-ohmic contacts to the EL material affects the interface therebetween, degrading operation and causing failure. Another limitation is the increased complexity of address and intensity modulation necessary for use as pixel elements in information display.

Still another limitation of prior art EL devices is that the address and intensity modulation circuitry must be separately manufactured and assembled to prior art diode pixel display devices thereby increasing the cost of the display product. Another limitation is the power requirements for the control circuitry which are orders of magnitude greater than the control circuitry for the presently disclosed device. Still another limitation of the diode pixel element is that light is emitted through the diode's transparent contact and not laterally as will be expanded upon in the following paragraph. This results in a significant percentage of light emission that is not utilized, thereby further increasing the power required in the prior art to obtain the desired level of luminescence.

In the prior art DC diode devices, one contact to the EL material of the diode is made by transparent indium-tin oxide (ITO), and the other by a metal which is typically Al. Both of those contacts are Schottky barrier, tunneling contacts. A reverse bias applied to the EL material produces a field across the depletion region. A sufficient field causes avalanche of energetic carriers which are typically electrons. The electrons impact excite centers, or color centers of the EL material, creating electron-hole pairs, and/or excitation of the color dopant atoms. Relaxation of the excitation within the EL materials causes photon, colored light, emission. Only the photons exciting the EL material parallel to the field produced laterally, perpendicular to the field, is essentially lost and does not markedly contribute to the brightness of the viewed light of the prior art.

U.S. Pat. No. 5,656,883 Alton O. Christensen, Sr., which is assigned to the assignee of the present disclosure and which is entered herein by reference, discloses a triode pixel device and complementary triode logic devices for control of the pixel devices. Both the pixel devices and the associated control circuitry are fabricated and interconnected in the same continuous manufacturing process to economically produce full color flat panel display products. Both pixel and logic devices are operated in a gate controlled avalanche mode. Pixels are formed of inorganic or organic EL material ohmically contacted by low work function metal. Luminescence is directly viewed through a glass substrate from the brighter, lateral EL emission which is an improvement over other previously discussed prior art devices. Operating potentials required are those of integrated circuits and are, therefore, low. Power consumption is reduced and the devices present no electromagnetic hazard to a user. The ohmic contacts to EL material and the gate terminal increase operating lifetime and failure problems of other previously discussed prior art direct current (DC) operated devices.

Although superior to other prior art devices, the pixel element devices and flat screen displays comprising these devices disclosed in U.S. Pat. No. 5,656,883 exhibit certain shortcomings and limitations. The deposition and subsequent etching process used to manufacture these devices is relatively expensive. Power requirements, although low when compared with other prior art devices, can still be substantial. The beneficial effects of gate control on power consumption leave room for economic improvement. The pixel structures and flat panel displays made therefrom are rigid and limited in geometry by the shape of the rigid substrate. Furthermore, the devices are somewhat less than robust in certain environments.

In view of the prior art, and object of the present invention is to provide a pixel element using conjugated polymer electroluminescent (CPEL) material which is less costly to manufacture in that the CPEL material can be spun on the substrate and therefore does not require expensive deposition systems used in prior art devices. These materials are also referred to as light emitting polymers (LEPs).

Another object of the present invention is to provide pixel devices which are higher in efficiency and require lower power to operate that prior art devices.

Yet another object of the present invention is to provide pixel elements that can be used to form flexible display panels rather that the rigid display panels taught in the prior art.

Still another object of the invention is to provide a pixel element with improved and more efficient gate control thereby further reducing power consumption.

Another object of the invention is to provide a flexible color display panel with numerous novel applications.

Yet another object of the present invention is to provide a more efficient optical interface between the CPEL and substrate directly by eliminating the ITO layer of the prior art.

There are other applications of the invention which will become apparent if the following disclosure.

SUMMARY OF THE INVENTION

The invention will be summarized first with a brief overview of conjugated polymer light emitting materials, followed by a discussion of pixel elements fabricated from this material and the use of these pixel to form flexible and robust display panels.

Conjugated polymers are organic semiconductors. These are polymers which possess what is known as a "delocalized pi-electron system" along the polymer backbone. Whereas a typical carbon molecule has four electron bonds, the conjugated polymers have two or three, leaving spare electrons that can join a cloud of electrons above and below the polymer chain. These clouds of electrons support positive and negative charge carriers with high mobilities along the polymer chain. The semiconductor properties of conjugated polymers arise from the overlap of the pz orbitals. If the overlap is over several sites, the formation of well delocalized pi (bonding state) and pi* (anti-bonding state) conduction band occurs, with a defined band gap. The bonding valance band state and the anti-bonding conduction band states are analogous with III-V semiconductors, and they provide the recipe for semiconductor behavior. Further details of the operating principles of CPEL material is presented in "Polymer LEDs and Displays: How Do They Work?", *Compound Semiconductor,* November/December, 32–33, (1996).

Light emitting conjugated polymers (LEPs) offer advantages over prior art semiconductors as summarized in the paper "Polymer-Based Displays", Kenward, M., *Compound Semiconductor,* November/December, 30–31, (1996). LEP material is easy to process and can employ cost effective manufacturing processes developed by the semiconductor industry for photoresist coating. As an example, LEPs can be spin coated from solution at room temperature thereby eliminating expensive deposition and etching processes used in convention semiconductor manufacture. Furthermore, LEPs can be spun onto on flexible, transparent substrates allowing flexible display panels to be fabricated will be discussed in detail in subsequent sections.

LEPs can be selected to fabricate pixel elements which emit light with wavelengths in the visible region such that color displays can be fabricated. LEP materials with luminescence emissions at a variety of "colors" is presented in the references Gustafsson, G. et al, *Nature* 357, 475–477 (1992); Burrough, J. H. et al, *Nature* 347, 539–541 (1990); Braun, D. and Heeger, A., *J. Appl. Phys. Lett.* 58, 1982–1984 (1991); Burn, P. L. et al, *Nature* 356, 47–49 (1992); and Grem, G. et al, *Adv. Mat.* 4, 36–38 (1992).

Configured as a triode, the disclosed conjugated polymer pixel elements comprise an injector electrode, a collector electrode, and a gate electrode enclosed in a dielectric material. The injector and collector electrodes and LEP material are deposited upon a transparent substrate such that the injector and collector electrodes form a field within the LEP material which is perpendicular to the substrate. The dielectric material containing the gate electrode is also bounded by the injector and collector electrodes, and contacts the LEP material at the surface opposite to the LEP-substrate interface. This arrangement allows the more intense emissions perpendicular to the applied field to be viewed through the transparent substrate.

The Pixel element can also be a diode, with the gate electrode being omitted.

The substrate material can be transparent glass, or preferably is flexible polymer or plastic material.

Flexible, monocolor display panel are fabricated by spin depositing a layer of LEP material on a large sheet of flexible, transparent substrate and then defining a plurality individual pixels by the placement or "patterning" of electrodes on the large, monolithic sheet of substrate and LEP material.

Color display panels are also fabricated by clustering pixels which emit light at selected, but differing, wavelengths in the visible spectrum. As an example, pixels emitting light in the blue, yellow and red regions of the visible spectrum are grouped to form a color pixel element, and multiple elements are fabricated on a flexible substrate and suitably addressed and controlled to yield a flexible, robust color LEP display panel.

BRIEF DESCRIPTION OF THE DRAWINGS

So that the manner in which the recited features, advantages and objects of the present invention are attained and can be understood in detail, more particular description can be had by reference to the embodiments thereof which are illustrated in the appended drawings. It is to be noted, however, that the appended drawings illustrate only typical embodiments of the invention and are not considered limiting of its scope, for the invention may admit to other equally effective embodiments.

DETAILED DESCRIPTION OF THE PREFERRED EMBODIMENTS

3. Triode LEP Pixel Element

Figure 1:
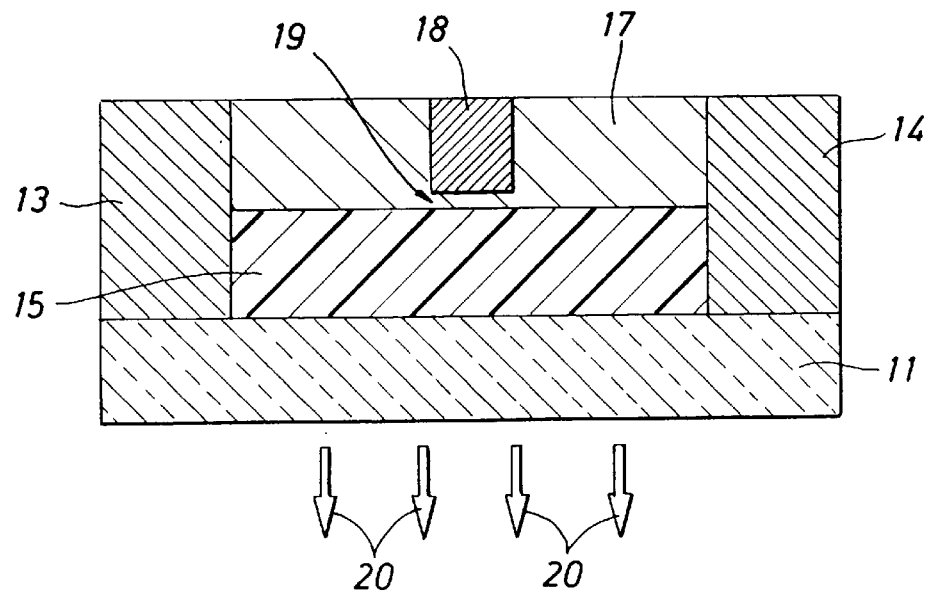
FIG. 1 is a cross section view of a triode pixel element which uses a conjugated polymer electroluminescent material.

Attention is directed to FIG. 1 which illustrates a cross section of a pixel element identified in general by the numeral 10. The elements of the pixel 10 are affixed to a substrate 11 which can be glass but is preferably flexible polymer or plastic. The illustrated pixel element 10 is a triode device comprising an injector electrode 13, a collector electrode 14, and a gate electrode 18 enclosed within a dielectric material 17. The injector electrode is preferably $Li_3Al_2$, and the collector electrode is preferably $Li_3Al_2$ or $Cr_3Si$. The gate electrode 18 is a conductor of higher work function, such as Al, Cu, metal silicide or doped polycrystalline silicon. Design of the gated device is similar to the well known design of IGFET devices. The parameters of the work function of the gate 18, and the thickness 19 of dielectric material contacting the gate, are chosen to control conduction of a contacting layer 15 of conjugated polymer electroluminescent material (CPEL). The CPEL material is alternately referred to as light emitting polymer (LEP) material. A variable potential applied to gate 18, in excess of the threshold voltage of a particular design, can change the CPEL layer 15 under the gate from a conducting region to a nonconducting region, or cause an avalanche of carriers between injector and collector. Such variable potential applied to the gate 18 can modulate the brightness of photon emission from none to high intensity. The injector and collector electrodes make ohmic contact with a layer of conjugated polymer electroluminescent layer 15 Of CPEL material, and create a field within the material which is horizontal as depicted in FIG. 1. The potential applied to gate electrode 18 controls the flow of charge within the region 19 thereby controlling the intensity of photon output from the CPEL material 15. Light output is most intense perpendicular to the applied field, and emitted light is viewed through the transparent substrate 11 as illustrated by the arrows 20. The CPEL material 15 requires the low work function of the $Cr_3Si$ and/or $Li_3Al_2$ to work effectively as will be discussed in a subsequent section.

The substrate 11 is preferably a flexible film of nonconducting polymer such as polyethylene terephthalate or similar polymer chosen for its efficient transmittal of photons.

Figure 3:
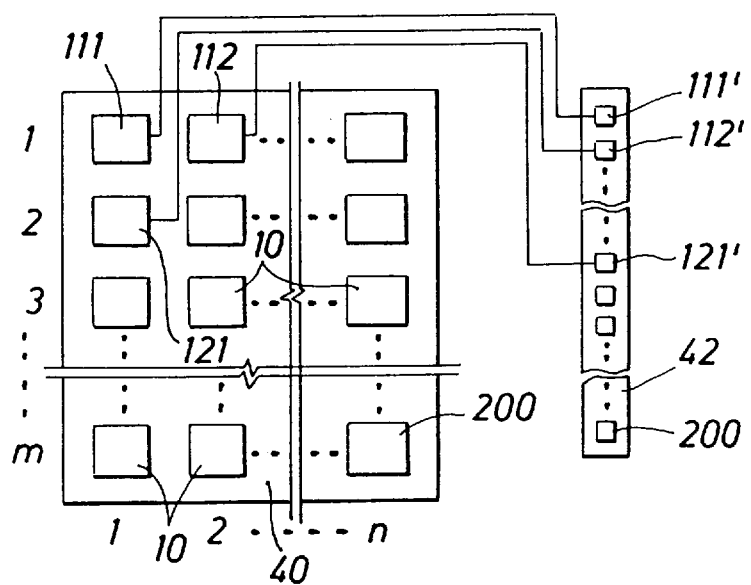
FIG. 3 in a conceptual layout of a display screen fabricated from an array of pixel elements and controlled by control logic circuitry.

Complementary logic elements (illustrated conceptually in FIG. 3) are used to control the pixel elements as described in U.S. Pat. No. 5,656,885 which has been previously entered into this disclosure by reference.

Each pixel element 10 can be surrounded by a dielectric material (not shown) such as black, optically absorbing oxide such as $NbO_2$, which serves to increase definition and contrast. This concept is discussed in more detail in U.S. Pat. No. 5,656,883.

4. Diode LEP Pixel Element

Figure 2:
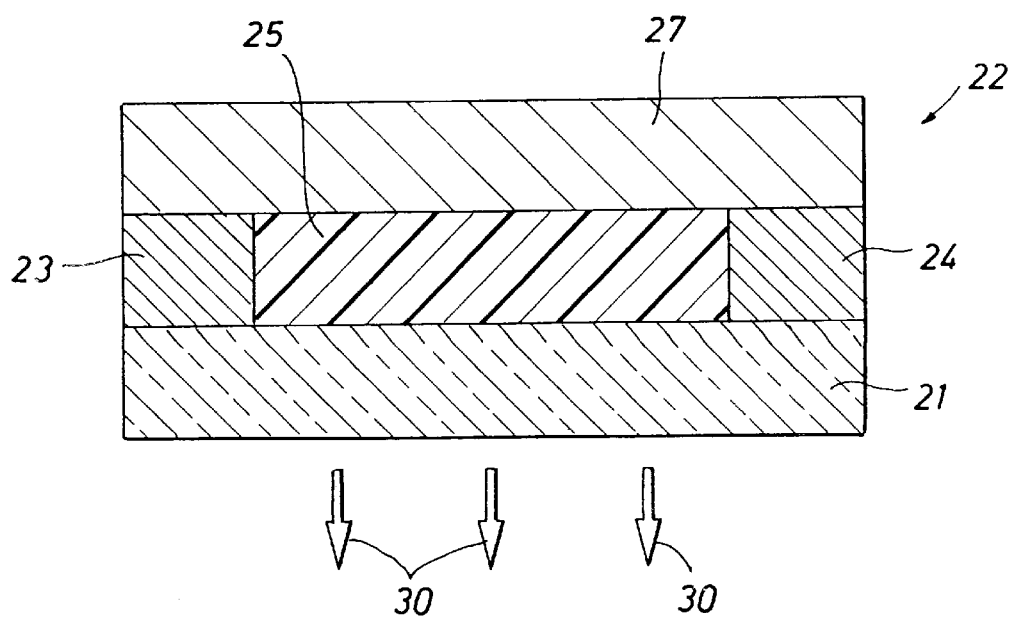
FIG. 2 is a cross section view of a diode pixel element which uses a conjugated polymer electroluminescent material.

Attention is directed to FIG. 2 which illustrates a cross section of a pixel element identified in general by the numeral 22. The elements of the pixel 22 are affixed to a substrate 21 which can be glass but is again preferably flexible polymer or plastic. The illustrated pixel element 22 is a diode device comprising an injector electrode 23, a collector electrode 24 covered with a dielectric material 27. These electrodes make ohmic contact with a layer of LEP 25, and create a field within the material which is horizontal as depicted in FIG. 2. As in the triode shown in FIG. 1, light output is most intense perpendicular to the applied field, and emission is viewed through the transparent substrate 21 as illustrated by the arrows 30.

Parker, I. D., J. Appl. Phys. 75 (3), 1658 (1994) discloses a diode using MEH-PPV as a LEP material with calcium being used as one electrode contact to the MEH-PPV diode and the other electrode contact being ITO (indium tin oxide). Calcium has a work function of 2.9 electron volts (eV) and ITO has a work function of 4.7 eV. The preferred contact electrodes 23 and 24 in the present diode pixel element is $Cr_3Si$ and/or $Li_3Al_2$ with work functions of 2.54 eV and 1.06 eV, respectively. The lower work functions associated with the electrodes of the present diode pixel increases the diode luminous efficiency over the referenced prior art device.

5. Display Panel

Flexible display panels are fabricated by spin depositing a layer of LEP material on flexible, transparent substrate and then defining a plurality individual pixels by the placement or "patterning" of electrodes on the resulting large, monolithic sheet of substrate and LEP material. Being flexible, the panels are much more robust than prior art rigid panels. Such a display panel is illustrated conceptually in FIG. 3. For purposes of illustration, assume that a display panel 40 consists of m×n triode pixels 10 arranged in m rows and n columns. Each pixel 10 is controlled by a complementary logic circuit which controls the output of the pixel element and which is addressable. As an example, a pixel 111 is positioned at row 1 and at column 1 of the display panel 40. The pixel 111 is controlled by a control logic circuit illustrated conceptually and identified by the numeral 111'. A pixel 112 is positioned at row 1, column 2 and is controlled by a control logic circuit 112'. A pixel 121 is positioned at row 2, column 1 and is controlled by a control logic circuit 121'. A pixel 200 is positioned at row m, column n and is controlled by a control logic circuit 200', and so forth. The control logic circuits are shown collectively as an element 42, but it should be understood that a portion of the circuit can be fabricated on the pixel elements as disclosed in previously referenced U.S. Pat. No. 5,656,883. Furthermore, the connections between pixel and corresponding control logic circuit is illustrated by a single line, but it should be under stood that each triode pixel 10 comprises three electrical connections for the injector, collector and gate interconnect to enable a gate control signal to be applied to the gate electrode, with a suitable bias voltage being supplies across the injector and collector electrodes and a suitable "signal" voltage being supplied to the gate electrode through the corresponding control logic circuit and gate interconnect. The gate interconnect can be fabricated from a metal such as aluminum.

Being fabricated on flexible substrate, the display panels made with conjugated polymer EL pixels can be formed into a variety of shapes not possible with prior art "flat" display panels which are rigid.

6. Color Display Panel

A fully conjugated polymer, comprised from a polyflourine source material with two benzene rings with alkyl chains, exhibits photon emission in the blue region. Such a material is manufactured by Dow Corning. Poly 2-methoxy, 5-(2'ethyl-hexoxy)-1,4-penylene-vinylene) or MEH-PPV exhibits photon. emission in the reddish-yellow region as reported by Braun, D. and Heeger, A., *J. Appl. Phys. Lett.* 58. Poly(p-phenylene vinylene) or PPV exhibits photon emission in the green-yellow region of the spectrum as reported by Burrough, J. H. et al, *Nature* 347, 539–541 (1990). LEP materials emitting photons in other regions of the visible spectrum are given in the references Gustafsson, G. et al, *Nature* 357, 475–477 (1992), Burn, P. L. et al, *Nature* 356, 47–49 (1992), and Grem, G. et al, *Adv. Mat.* 4, 36–38 (1992).

Figure 4:
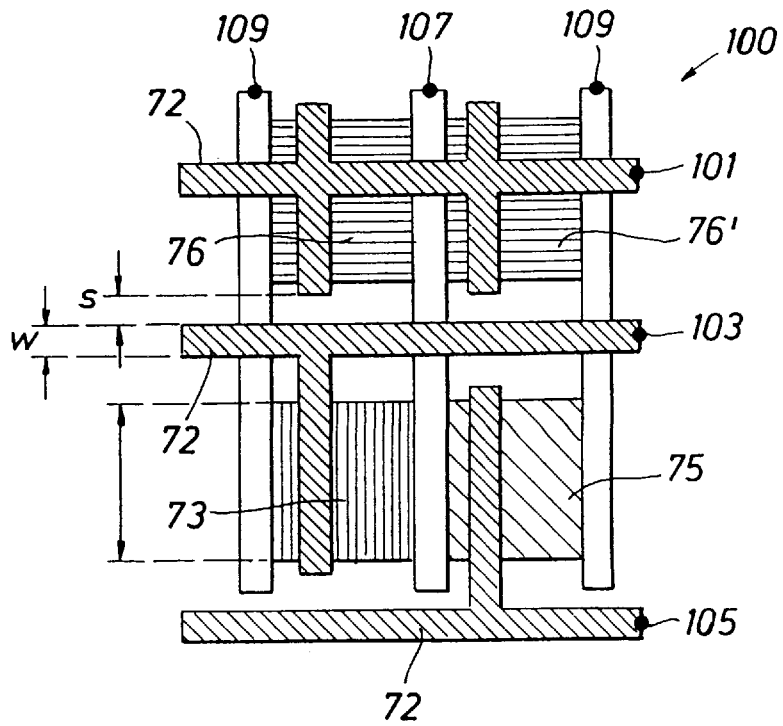
FIG. 4 is a planar view of a color pixel element which consists of one red, one green and two blue emitting pixels devices.

A color display panel is fabricated using an array of color pixel elements, where conjugated polymer material is selected for each pixel device to produce photon emission in a desired region of the color spectrum, and where each color pixel element consists of an interconnection of these individual pixel devices. FIG. 4 is a planar view of a color pixel element 100 which consists of one each red 73 and green 75 emitting pixels, and two blue emitting pixels 76 and 76'. The darker cross hatched metal of FIG. 4 is a second metal layer 72, insulated from and above a common ground layer with connections 109, and addressed through a power bus with a connection 107. The full color pixel 100 is therefore comprised of an array of red 73, green 75 and blue 76 and 76' pixel devices whose column addresses are connected in parallel, and whose row gates are addressable by color. Thus, row gate addressing by color addressing through the connections 101, 103, and 105 and column addressing through the connection 107 achieves a full color addressable pixel element.

The topology illustrated in FIG. 4 may be used in a manifold redundancy as a single color pixel in a large area color panel displays. Each color pixel is expandable principally in the indicated Y dimension in FIG. 13 to the requirements of the pixel density.

The minimum area required by the topology of FIG. 4 depends upon the minimum dimension set for the line width, indicated as w, and the spacing between lines, indicated by s, in FIG. 4. The minimum line width of state of the art manufacturing process continues to shrink toward 0.1 micron. The result of such decreasing dimensions is to allow pixel densities to increase well beyond 10 million per square inch. Such pixel densities meet the most demanding requirements for high definition military and avionic head mounted displays, and for virtual reality displays. The robustness of the panels, and the ability to flex and shape the panels, further enhances these and other applications.

The foregoing is directed to the preferred embodiments of the invention, but the scope of the invention is determined by the claims which follow.

What is claimed is:

1. An integrally fabricated gated pixel element affixed to an optically transparent substrate wherein said pixel element comprises:

(a) conjugated polymer electroluminescent material;

(b) an injector electrode in ohmic contact with said conjugated polymer electroluminescent material;

(c) a collector electrode in ohmic contact with said electroluminescent material;

(d) a gate interconnect to enable a control gate signal to be applied to said pixel; and (e) a gate electrode in contact with said gate interconnect and separated from said conjugated polymer electroluminescent material by dielectric material.

2. The pixel element of claim 1 wherein:

(a) said substrate is flexible, and (b) said conjugated polymer electroluminescent material is deposited as a flexible layer upon said substrate.

3. The pixel element of claim 1 wherein said injector electrode and said collector electrode comprise $Li_3Al_2$.

4. The pixel element of claim 1 wherein said injector electrode comprises $Li_3Al_2$ and said collector electrode comprises $Cr_3Si$.

5. The pixel element of claim 1 wherein said conjugated polymer electroluminescent material comprises polyflourine with two benzene rings with alkyl chains.

6. The pixel element of claim 1 wherein said conjugated polymer electroluminescent material comprises MEH-PPV.

7. The pixel element of claim 1 wherein said conjugated polymer electroluminescent material comprises PPV.

8. The pixel element of claim 1 wherein said substrate comprises polyethylene terephthalate.

9. An integrally fabricated diode pixel element affixed to an optically transparent substrate wherein said pixel element comprises:

(a) conjugated polymer electroluminescent material;

(b) an injector electrode in ohmic contact with said conjugated electroluminescent material; and (c) a collector electrode in ohmic contact with said electroluminescent material.

10. The pixel element of claim 9 wherein:

(a) said collector electrode comprises $Cr_3Si$; and (b) said injector electrode comprises $Li_3Al_2$.

11. The pixel element of claim 9 wherein conjugated polymer electroluminescent material comprises PPV.

12. The pixel element of claim 9 wherein said substrate comprises polyethylene terephthalate.

13. An integrally fabricated gated pixel element in a display of plural pixel elements affixed to a common optically transparent substrate wherein said pixel element comprises:

(a) conjugated polymer electroluminescent material;

(b) an injector electrode in ohmic contact with said conjugated polymer electroluminescent material;

(c) a collector electrode in ohmic contact with said conjugated polymer electroluminescent material;

(d) a gate interconnect to enable a control gate signal to be applied to said pixel; and (e) a gate electrode in contact with said gate interconnect and separated from said conjugated polymer electroluminescent material by a thin layer of dielectric material.

14. The apparatus of claim 13 wherein said electroluminescent material is selected to emit photons in a desired region of the visible spectrum, and said electroluminescent material is organic.

15. The apparatus of claim 13 wherein said injector electrode is $Li_3Al_2$.

16. The apparatus of claim 15 wherein said collector electrode is $Li_3Al_2$.

17. The apparatus of claim 15 wherein said collector electrode is $Cr_3Si$.

18. The apparatus of claim 13 wherein:

(a) said gate electrode comprises a high work function; and (b) said gate electrode is selected from the group of Al, Cu, metal silicide or doped polycrystalline silicon.

19. The apparatus of claim 18 wherein said control gate signal comprises a variable potential applied to said gate electrode by said gate interconnect thereby changing said conjugated polymer electroluminescent material from a conducting region to a nonconducting depletion region or causes avalanche of carriers between said injector and collector electrode, thereby controlling brightness of photon emission from said conjugated polymer electroluminescent material.

20. The apparatus of claim 13 wherein said conjugated polymer electroluminescent material produces red, green or blue electroluminescence.

21. The apparatus of claim 13 wherein said conjugated polymer electroluminescent material comprises polyflourine with two benzene rings with alkyl chains.

22. The apparatus of claim 13 wherein said conjugated polymer electroluminescent material comprises MEH-PPV.

23. The apparatus of claim 13 wherein conjugated polymer electroluminescent material PPV.

24. The apparatus of claim 13 wherein said substrate comprises a flexible film.

25. The apparatus of claim 24 wherein said flexible film comprises polyethylene terephthalate.

26. An flexible, integrally fabricated, gated control element in a display on a flexible, supportive substrate wherein said element comprises:

(a) a current controlled material;

(b) an injector electrode of $Li_3Al_2$ in ohmic contact with said current controlled material;

(c) a collector electrode in ohmic contact with said current controlled material;

(d) a gate interconnect to provide a control gate signal; and (e) a gate electrode in contact with said gate interconnect to control current flow to said current controlled material.

27. The apparatus of claim 26 wherein said gate electrode is separated from said current controlled material by a layer of dielectric; and said current controlled material is conjugated polymer electroluminescent material.

28. The apparatus of claim 27 wherein:

(a) said conjugated polymer electroluminescent material is organic;

(b) said collector is $Cr_3Si$; and (c) said supportive substrate is transparent.

29. The apparatus of claim 28 wherein said substrate comprises polyethylene terephthalate.

30. The apparatus of claim 28 wherein said gate electrode is a high work function material and said gate interconnect is aluminum or an alloy thereof and further includes dielectric encapsulating material around said gated control element.

31. The apparatus of claim 26 wherein said current control material produces red, green or blue electroluminescence.

32. The apparatus of claim 31 wherein said current control material comprises polyflourine with two benzene rings with alkyl chains.

33. The apparatus of claim 31 wherein said current control material comprises MEH-PPV.

34. The apparatus of claim 31 wherein said current control material comprises PPV.

35. A method for operating a flexible display matrix integrated circuit element comprising the steps of:

(a) forming a triode element comprising an injector and a collector electrode in ohmic contact with a current controlled material, and further comprising a gate electrode in separated from said current controlled material by a thin layer of dielectric material;

(b) creating and modulating the extent of a depletion region within said current controlled material in the vicinity of said gate electrode by varying the potential of said gate electrode;

(c) applying a voltage potential across said injector and collector electrodes;

(d) changing the potential of said gate electrode until avalanche occurs within said current controlled material between said injector and said collector electrodes; and (e) changing the integrated circuit conditions resulting from said avalanche condition.

36. The method of claim 35 wherein said triode forming step comprises the additional steps of:

(a) providing a substrate comprising a flexible, transparent film; and (b) spinning said current control material onto said substrate.

37. The method of claim 36 comprising the additional steps of:

(a) forming a plurality of said triode elements on a common said flexible substrate; and (b) configuring said plurality of triode elements to form a panel display.

38. The method of claim 37 comprising the additional step of flexing said substrate to operate said display panel in a curved geometry.

* * * * *